(12) United States Patent
Bienfang et al.

(10) Patent No.: US 9,401,448 B2
(45) Date of Patent: Jul. 26, 2016

(54) PHOTON DETECTOR AND PROCESS FOR DETECTING A SINGLE PHOTON

(71) Applicants: NATIONAL INSTITUTE OF STANDARDS AND TECHNOLOGY, Gaithersburg, MD (US); CALIFORNIA INSTITUTE OF TECHNOLOGY, Pasadena, CA (US); UNIVERSITY OF MARYLAND, COLLEGE PARK, College Park, MD (US)

(72) Inventors: Joshua C. Bienfang, Bethesda, MD (US); Alan Migdall, Gaithersburg, MD (US); Alessandro Restelli, Greenbelt, MD (US); William H. Farr, Monrovia, CA (US)

(73) Assignees: NATIONAL INSTITUTE OF STANDARDS AND TECHNOLOGY, Gaithersburg, MD (US); CALIFORNIA INSTITUTE OF TECHNOLOGY, Pasadena, CA (US); UNIVERSITY OF MARYLAND, COLLEGE PARK, College Park, MD (US)

( * ) Notice: Subject to any disclaimer, the term of this patent is extended or adjusted under 35 U.S.C. 154(b) by 139 days.

(21) Appl. No.: 14/547,189

(22) Filed: Nov. 19, 2014

(65) Prior Publication Data

US 2015/0076361 A1 Mar. 19, 2015

(51) Int. Cl.
*G01J 1/00* (2006.01)
*H01L 31/107* (2006.01)

(52) U.S. Cl.
CPC .................................. *H01L 31/107* (2013.01)

(58) Field of Classification Search
CPC ........................................................ H01L 31/00
See application file for complete search history.

(56) References Cited

PUBLICATIONS

Salah et al., "Experimental analysis of punch-through conditions in power PIN diodes," 2007, IEEE Transactions on power electronics, vol. 22 No. 1, pp. 13-20.*

* cited by examiner

*Primary Examiner* — Kiho Kim
(74) *Attorney, Agent, or Firm* — Toby D. Hain

(57) ABSTRACT

A photon detector article includes a photon detector configured to receive a primary waveform, the photon detector includes a multiplication region; a photon absorption region; a punch through voltage range; and a breakdown voltage; a source in electrical communication with the photon detector and configured to provide the primary waveform that includes a first voltage that is: less than a maximum value of the punch through voltage range, or effective to maintain a charge carrier in the absorption region; and a second voltage that is greater than the breakdown voltage; and a reference member in electrical communication with the source and configured to provide a reference waveform in response to receiving the primary waveform.

19 Claims, 11 Drawing Sheets

US 9,401,448 B2

PHOTON DETECTOR AND PROCESS FOR DETECTING A SINGLE PHOTON

STATEMENT REGARDING FEDERALLY SPONSORED RESEARCH

This invention was made with United States government support from the National Institute of Standards and Technology. The government has certain rights in the invention.

CROSS REFERENCE TO RELATED APPLICATIONS

This application claims the benefit of U.S. Provisional Patent Application Ser. No. 61/905,887 filed Nov. 19, 2013, the disclosure of which is incorporated herein by reference in its entirety.

BACKGROUND

Light sensors provide detection of photons. Some sensors are optimized for narrow band operation to detect light in a narrow wavelength region. Other sensors detect light over a broad wavelength range. Typical sensors detect multiple photons and operate continuously by biasing the sensor to detect all incident photons at the sensor within a wavelength range that the sensor can detect with a maximum detection limit at a saturation value or a damage threshold. However, many sensors cannot detect single photons. To fill this gap specialized sensors were developed to detect single photons, but many of the specialized sensors detect a limited number of single photon events or fail to detect random arrival of a single photon at the specialized sensor.

Accordingly, the art is receptive to articles and processes that overcome such difficulties.

BRIEF DESCRIPTION

The above and other deficiencies are overcome by, in an embodiment, a photon detector article comprising: a photon detector configured to receive a primary waveform, the photon detector comprising: a multiplication region; a photon absorption region; a punch-through voltage range; and a breakdown voltage; a source in electrical communication with the photon detector and configured to provide the primary waveform that comprises: a first voltage that is: less than a maximum value of the punch-through voltage range, or effective to maintain a charge carrier in the absorption region; and a second voltage that is greater than the breakdown voltage; and a reference member in electrical communication with the source and configured to provide a reference waveform in response to receiving the primary waveform.

Further disclosed is a process for detecting a single photon, the process comprising: producing, by a source, a primary waveform that comprises: a first voltage; and a second voltage; receiving, by a photon detector, the primary waveform, the photon detector comprising: a punch-through voltage such that the first voltage is: less than a maximum value of the punch-through voltage range, or effective to maintain a charge carrier in the absorption region; and a break down voltage that is less than the second voltage; biasing the photon detector according to the primary waveform; receiving, by the photon detector, a single photon; producing, by the photon detector, a photon detector waveform in response to receiving the single photon and the primary waveform, the photon detector waveform comprising: a positive pulse corresponding to a transition from the first voltage to the second voltage; a negative pulse corresponding to a transition from the second voltage to the first voltage; and a signal pulse interposed between the positive pulse and the negative pulse; receiving, by a reference member, the primary waveform; producing, by the reference member, a reference waveform in response to receiving the primary waveform; combining, by a combiner, the photon detector waveform and the reference waveform; producing, by the combiner, a signal waveform consisting essentially of the signal pulse; and detecting, by a detector, the signal pulse to detect the single photon.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments is presented herein by way of exemplification and not limitation.

It has been found that a photon detector having an absorption region and multiplication region is configured to detect photons wherein the photon detector has an increased duty cycle when the photon detector is subjected to a waveform to bias the photon detector such that a minimum voltage of the waveform is sufficiently low that charge carriers generated in the absorption region are inhibited from being displaced from the absorption region and being disposed in the multiplication region. In this manner, when a maximum voltage of the waveform exceeds a breakdown voltage of the photon detector effective to produce a signal pulse from a charge carrier (e.g., a single charge carrier), detection of a photon absorbed during the application of the minimum voltage of the waveform is achieved. Consequently, subjecting the photon detector to the waveform advantageously increases a duty cycle of the photon detector as compared to biasing the photon detector above the breakdown voltage or at a voltage level less than or substantially similar to the breakdown voltage to detect photons incident at the absorption region.

Figure 1:
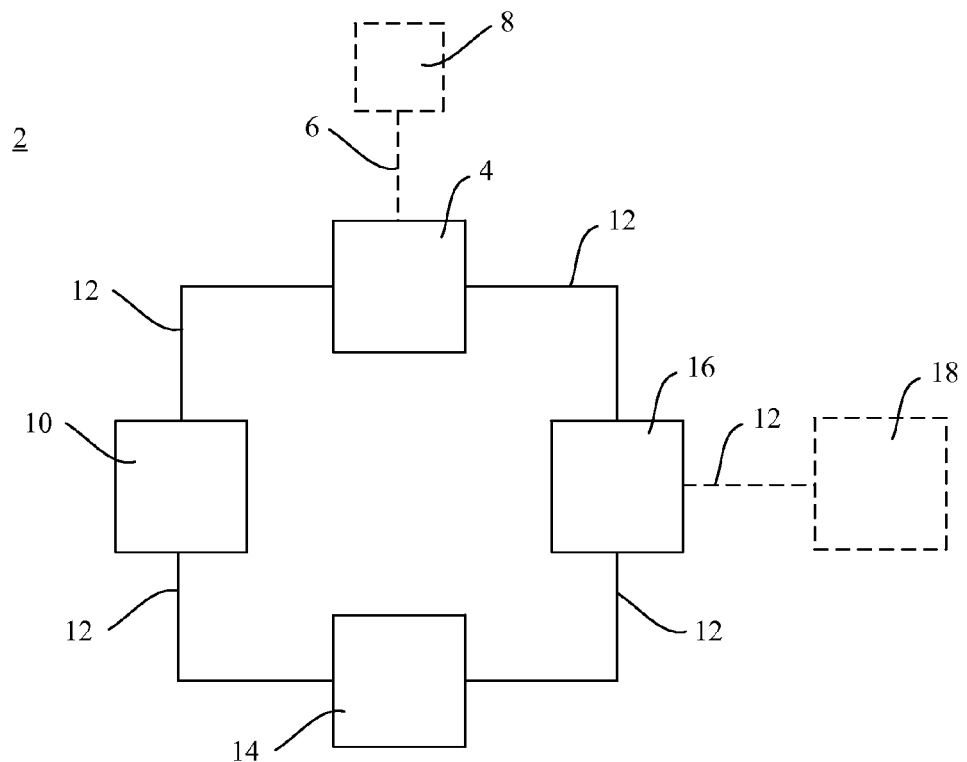
FIG. 1 shows a photon detection article.

According to an embodiment, as shown in FIG. 1, photon detection article 2 includes source 10 that is in electrical communication with photon detector 4 and reference member 14. Photon detector 4 and reference number 14 are in electrical communication with combiner 16, which optionally is in electrical communication with detector 18.

Source 10 is configured to produce a primary waveform and communicate the primary waveform to photon detector 4 and reference member 14. Photon detector 4 is configured to receive the primary waveform or a photon provided by light source 8 and to produce a photon detector waveform, which is communicated to combiner 16. Reference number 14 is configured to receive the primary waveform from source 10 and to produce a reference waveform, which is communicated to combiner 16. Combiner 16 is configured to receive the photon detector waveform and the reference waveform and to produce a signal waveform, which is communicated to detector 18. According to an embodiment, electrical communication of a waveform (e.g., primary waveform, reference waveform, photon detector waveform, signal waveform, and the like) in photon detection article 2 occurs, e.g., electrical path 12. It is contemplated that electrical path 12 is an optical path (e.g., free space, fiber optic, and the like), wired path, wireless path, or combination thereof.

Figure 2A:
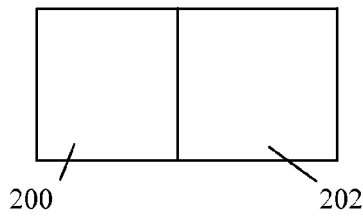
FIGS. 2A and 2B show a cross-section of a photon detector.
Figure 2B:
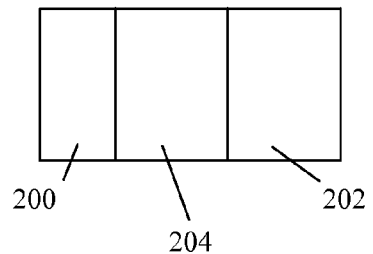

According to an embodiment, photo detector 4 is configured to receive the photon and primary waveform into produce the photon detector waveform. Exemplary photon detectors 4 include a diode, specifically in avalanche diode, and more specifically a single-photon avalanche diode. In an Embodiment, as shown in FIG. 2A, photon detector 4 includes multiplication region 200 and absorption region 202. In some embodiments, photon detector 4 includes grading region 204 as shown in FIG. 2B. It is contemplated that photon detector 4 includes an electrode such as a cathode electrode and an anode electrode to receive the primary waveform.

Absorption region 202 is configured to receive the photon and produce a charge carrier, e.g., an electron and hole. Without wishing to be bound by theory, it is believed that the charge carrier in presence of an electric field across absorption region 204 moves in absorption region 202, out of absorption region 202, and into multiplication region 200. In multiplication region 200, the charge carrier produces a plurality charge carriers via collisions with elements disposed in multiplication region 200 under a first electrical condition, i.e., in response to photon detector 4 being subjected to a voltage greater than a breakdown voltage of photon detector 4. However, in multiplication region 200, the charge carrier moves through multiplication region 200 but does not produce a plurality of charge carriers under a second electrical condition, i.e., in response to photon detector 4 being subjected to a voltage that is less than a breakdown voltage of photon detector 4. In the second electrical condition, the charge carrier moves through multiplication region 200 to be incident at the electrode and removed from multiplication region 200. In this manner, the charge carrier produced in absorption region 202 produces the plurality of charge carriers in multiplication region 202 based on subjecting photon detector 4 to a voltage that is greater than the breakdown voltage of photon detector 4. According to an embodiment, photon detector 4 is subjected to voltage according to the primary waveform provided by source 10. It is contemplated that when photon detector 4 is biased below breakdown voltage (referred to as "linear mode")' an average amount of multiplication is below unit efficiency, e.g., less than 100 times lower, so a charge carrier may not produce a signal that has an amplitude large enough to be detected. In an embodiment, when biased above breakdown, the multiplication process goes into a "runaway mode", and multiplication of charge carriers (or gain) may be undefined.

According to an embodiment, photon detector 4 includes multiplication region 200 and photon absorption region 202 arranged such that photon detector 4 has a selected punch through voltage range and the breakdown voltage.

In an embodiment, multiplication region 200 and absorption region 202 independently include a semiconductor. An exemplary semiconductor is an element from group 11, 12, 13, 14, 15, or 16 (IUPAC nomenclature, which respectively is identical to group I, II, III, IV, V, or VI) of the periodic table such as a Si, Ga, Ge, As, In, Sn, Sb, Te, At, Hf, Zn, P, and the like, or a combination thereof. According to an embodiment, the semiconductor is a compound semiconductor such as SiC, SiGe, GaN; a group 13-15 (also referred to as a group III-V) semiconductor such as AlSb, AlAs, Aln, AlP, BN, GaSb, GaAs, GaN, GaP, InSb, InAs, InN, InP, and the like; a group 12-16 (group II-VI) semiconductor such as CdSe, CdS, CdTe, ZnO, ZnSe, ZnS, ZnTe, and the like; a group 11-17 (group I-VII) semiconductor such as CuCl and the like; a group 14-16 (group IV-VI) semiconductor such as PbS, PbTe SnS, and the like; a layer semiconductor such as PbI2, MoS2, GaSe, and the like; an oxide semiconductor such as CuO, Cu2O, and the like; (Al,Ga)N, (Al,Ga)As, (In,Ga)As, (Al,Ga)Sb, (In,Ga)Sb, as well as nitride, arsenide, antimonide quaternary III—V alloys, or a combination comprising at least one of the foregoing. Examples of II-VI alloys include, but are not limited to CdSe, CdTe, CdS, ZnSe, and combinations thereof. Examples of Group III-V ternary alloys include, but are not limited to, (Ga,Al)As, (In,Ga)As, and combinations thereof. Exemplary Group III-V quaternary alloys include (Ga,In)(As,P), (In,Al,Ga)Sb, and the like. Exemplary Group III-nitride alloys include (Ga,Al)N, (Ga,In)N, (Al,In)N, (Ga,Al,In)N, and combinations thereof. Quaternary alloys of the above may also be employed.

The semiconductor also can include a supplemental element such as C, H, N, Li, Na, K, Mg, Ca, Sr, Ba, Bi, B, Al, P, S, O, and the like in an amount typically less than an amount of the semiconductor element. In an embodiment, the semiconductor is optionally doped. According to an embodiment, the semiconductor is an intrinsic semiconductor or an extrinsic semiconductor doped with a selected dopant, e.g., a p-dopant or an n-dopant. In one embodiment, the semiconductor includes a p-dopant. In another embodiment, the semiconductor includes an n-dopant. In a particular embodiment, the semiconductor is p-doped (InGa)As. In one embodiment, the semiconductor is n-doped InP. The semiconductor can be produced from, e.g., commercially available p-doped semiconductor having a particular crystalline orientation, e.g., having Miller indices <111>, <100>, <314>, and the like. The semiconductor can be amorphous, polycrystalline, or a single crystal. In an embodiment, the semiconductor has a stacked structure that includes a plurality of semiconductor layers such as by forming films as SiGe/Si/SiGe/Si on a substrate, e.g., a silicon substrate, SiN substrate, and the like. In some embodiments, the semiconductor includes crystalline domains among amorphous material. The semiconductor in absorption region 202 is selected to absorb light and create charge carriers, e.g., electrons and holes. The charge carriers have a high mobility in absorption region 202, and the semiconductor in absorption region 202 communicates either holes or electrons toward multiplication region 200, and the oppositely charged charge carrier away from multiplication region 200. The semiconductor in multiplication region 200 is selected to create a plurality of charge carriers from the charge carrier communicated to multiplication region 200 from absorption region 202 with a selected multiplication gain or multiplication efficiency.

According to an embodiment, multiplication region 200 includes InP. In an embodiment, absorption region 202 includes InGaAs. In a certain embodiment, grading layer 204 includes an intermediate material that includes an element found in multiplication region 200 (e.g., In, P, and the like) and absorption region 202 (e.g., In, Ga, As, and the like) such that the intermediate material is a doped or undoped semiconductor, e.g., indium gallium arsenic phosphide (InGaAsP), AlGaInAs.

Electrodes (e.g., anode, cathode) independently can include a conductive material that has a high electrical conductivity and that efficiently communicates charge. Exemplary conductive materials include graphite, graphene, carbon fibers, metallic nanoparticles (e.g., carbon nanotubes that metallic-(n,m)-nanotubes), metal (e.g., the first metal or the second metal) and the like. An electrical conductivity of the conductive material is effective to conduct electrons. The conductive material includes a transition metal, alkaline earth metal, alkali metal, rare earth metal, metal carbide, metal oxide, metal sulfide, non-metals (e.g., graphene, carbon nanotubes, carbon black, and the like), or a combination thereof. Exemplary metals include Zr, Hf, Ti, V, Cr, Mn, Fe, Co, Ni, Cu, Zn, Nb, Mo, Tc, Ru, Rh, Pd, Ag, Cd, Ta, W, Re, Os, Ir, Pt, Au, Li, Na, K, Be, Mg, Ca, Sr, Ba, Gd.

The electrode can be an optically transparent conductive metal, e.g., a metal oxide such as indium tin oxide. The electrode receives charge carriers, e.g., holes or electrons from multiplication region 200 or absorption region 202 and can be an electrical contact pad for connection to other components such as a wire or other electrical conductor for communication of voltage or current.

In an embodiment, photon detector 4, in addition to multiplication region 202 and absorption region 200, includes an ancillary layer. Exemplary ancillary layers include a substrate layer (e.g., n-doped InP), buffer layer (e.g., undoped InP), etch-stop layer (e.g., undoped InGaAs), n-side contact layer (e.g., n-doped InP), current spreading buffer layer (e.g., InAlAs), electric field control layer (e.g., p-doped InAlAs), current spreading buffer layer (e.g., p-doped InAlAs), p-side contact layer (e.g., p-doped InGaAs), and the like.

The photon detector can be from a commercial source or produced using a semiconductor processing methodology. According to an embodiment, a process for making photo detector 4 includes forming multiplication region 200 or absorption region 202 by growing the semiconductor in multiplication region 200 or absorption region 202 via molecular beam epitaxy, metallorganic vapor phase epitaxy, or combination thereof. In an embodiment, a dopant is included in the semiconductor by deposition, diffusion, ion implantation, and the like. The dopant can be present in a number density effective to produce an n-doped or p-doped semiconductor.

With reference to FIGS. 3A, 3B, 3C, and 3D, source 10 is configured to produce primary waveform 20, and photon detector 4 is configured to receive primary waveform 20 communicated via electrical path 12. Primary waveform 20 includes a voltage by which photon detector 4 is biased. In an embodiment, primary waveform 20 includes first voltage V1 and second voltage V2, an amplitude of which is graphed versus time in FIG. 3A. Here, photon detector 4 includes breakdown voltage VB and punch-through voltage VP, wherein the first voltage V1 is less than punch-through voltage VP, and second voltage V2 is greater than the breakdown voltage VB. Primary waveform 20 includes first transition T1 and third transition T-3 from first voltage V1 to second voltage V2 that occurs respectively at first time t1 and third time t3. Primary waveform 20 also includes second transition T2 and fourth transition T2 from second voltage V2 to first voltage V1 that occurs respectively at second time t2 and force time t4. Primary waveform 20 further includes first gate 22 having first temporal width W1 and second voltage V2, second gate 24 padding second temporal width W2 and second voltage V2. Inter-gate period 26 is interposed between first gate 22 and second gate 24 and includes first voltage V1.

Figure 3A:
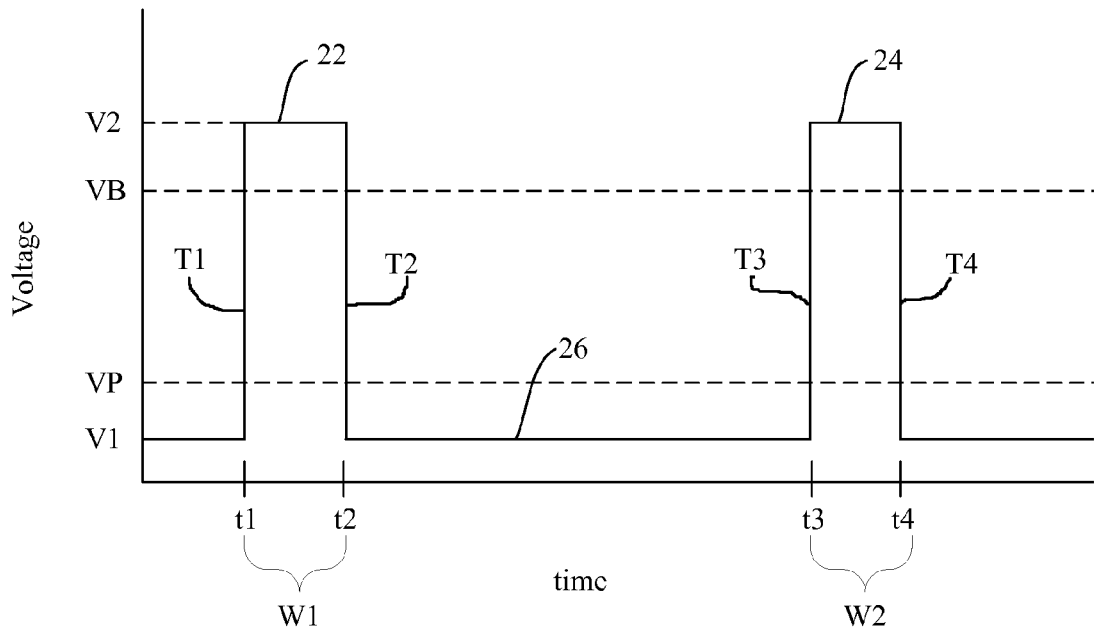
FIGS. 3A, 3B, 3C, and 3D show a graph of voltage versus time for a primary waveform.
Figure 3B:
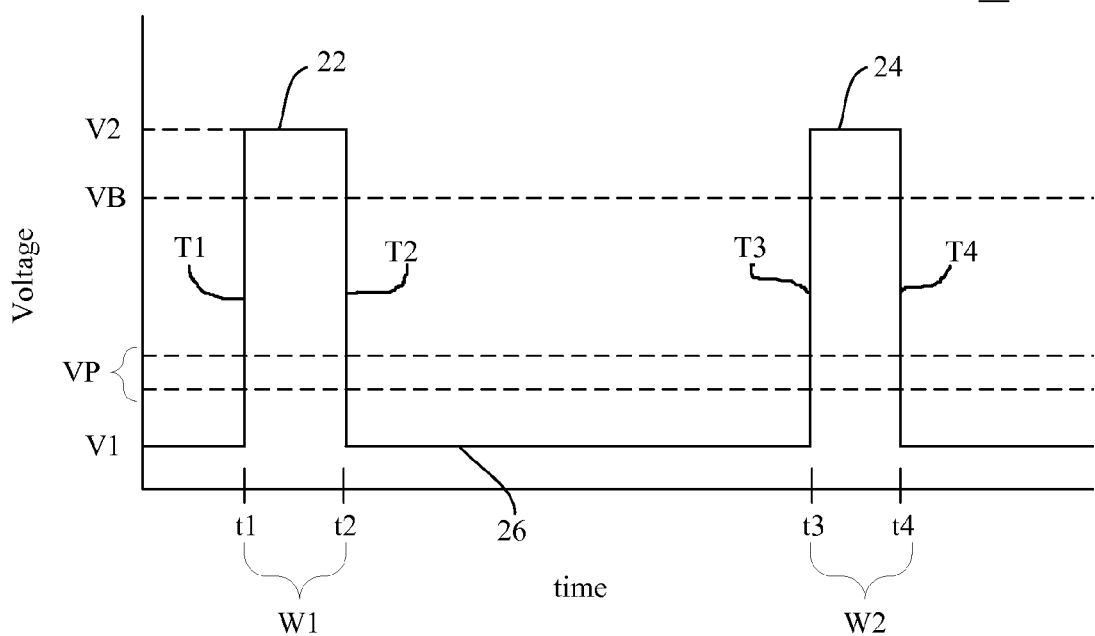
Figure 3C:
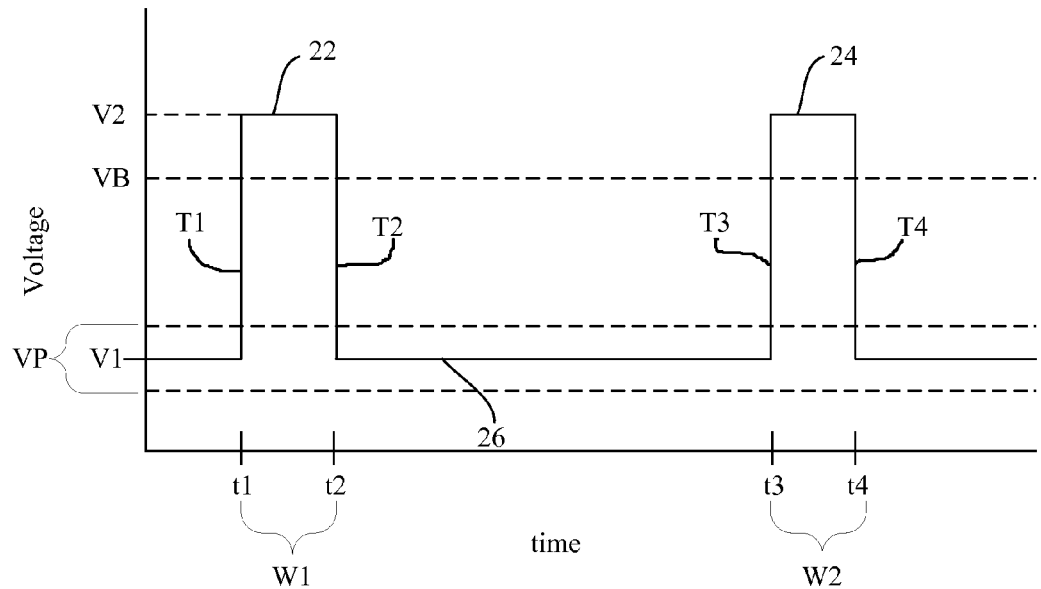
Figure 3D:
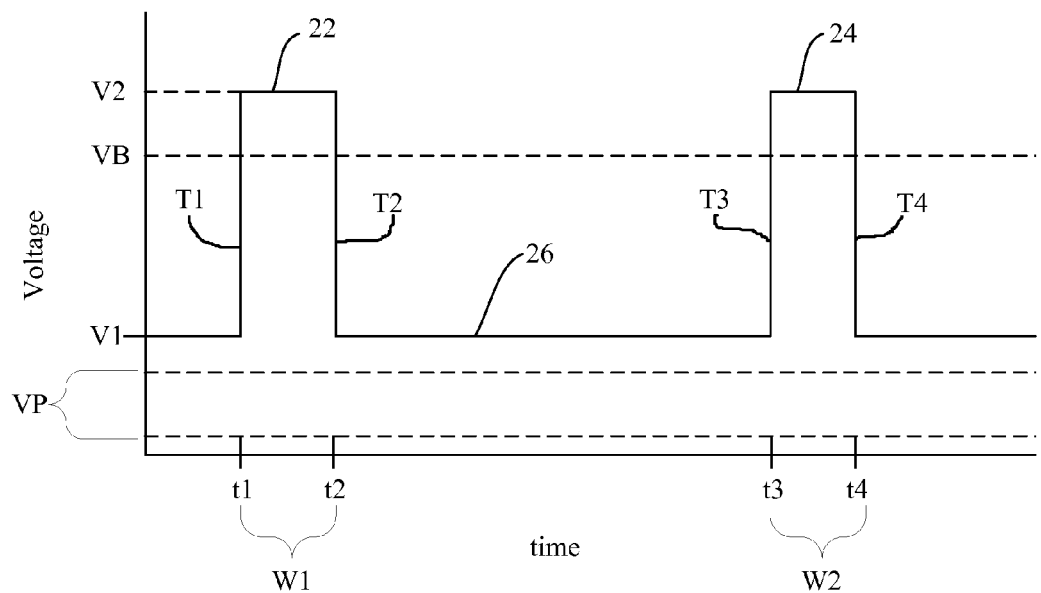

In FIG. 3A, punch-through voltage VP is shown as a single value. However, it is contemplated that punch-through voltage VP, in some embodiments, includes a range of voltage values as indicated in FIGS. 3B, 3C, and 3D. With reference to FIG. 3B, first voltage V1 of inter-gate period 26 is less than punch-through voltage range VP. According to an embodiment, as shown in FIG. 3C, inter-gate gate period 26 and first voltage V1 has a voltage amplitude that is within a range of voltage amplitudes of punch-through voltage range VP. That is, first voltage V1 is greater than a minimum value of punch-through voltage range VP and less than a maximum value of punch-through voltage range VP. In some embodiments, as shown in FIG. 3D, first voltage V1 and inter-gate period 26 is a voltage amplitude that is greater than a maximum value of punch-through voltage range VP. According to an embodiment, first gate 22 and second gate 24 occur periodically in time at a selected frequency. In an embodiment, first gate 22 and second gate occur aperiodically such that the primary waveform 20 includes a plurality of first gates 202 and a plurality of second gates 24 that respectively occur at a selected first time t1 and second time t3.

First voltage V1 is sufficiently low amplitude relative to breakdown voltage VB such that charge carriers generated by absorption of the photon in photon absorption region 202 are inhibited from moving from absorption region 202 into multiplication region 200. Moreover, second voltage V2 is greater than avalanche breakdown voltage VB, which can be, e.g., an avalanche breakdown voltage of a photo detector 4 that is a single-photon avalanche diode. By virtue of an amplitude of first voltage V1 relative to punch-through voltage range VP and breakdown voltage VB, photon detector 4 selectively detects the charge carrier produced by the photon that was incident in absorption region 202 and that produced the charge carrier.

In an embodiment, photon detector 4 is configured to receive and to be biased by primary waveform 20 having first voltage V1 and second voltage V2. Application of a voltage (e.g., first voltage V1, second voltage V2, and the like) across photon detector 4, i.e., subjecting photon detector 4 to an electrical potential difference across absorption region 202 and multiplication region 200, produces first electric field E1 in multiplication region 200 and a second electric field E2 in absorption region 202. It is contemplated that a strength of first electric field E1 (in multiplication region 200) is greater than a strength of second electric field E2 (in absorption region 202). Accordingly, the charge carrier experiences a greater acceleration and force in multiplication region 200 than an acceleration and force in absorption region 202.

Figure 4:
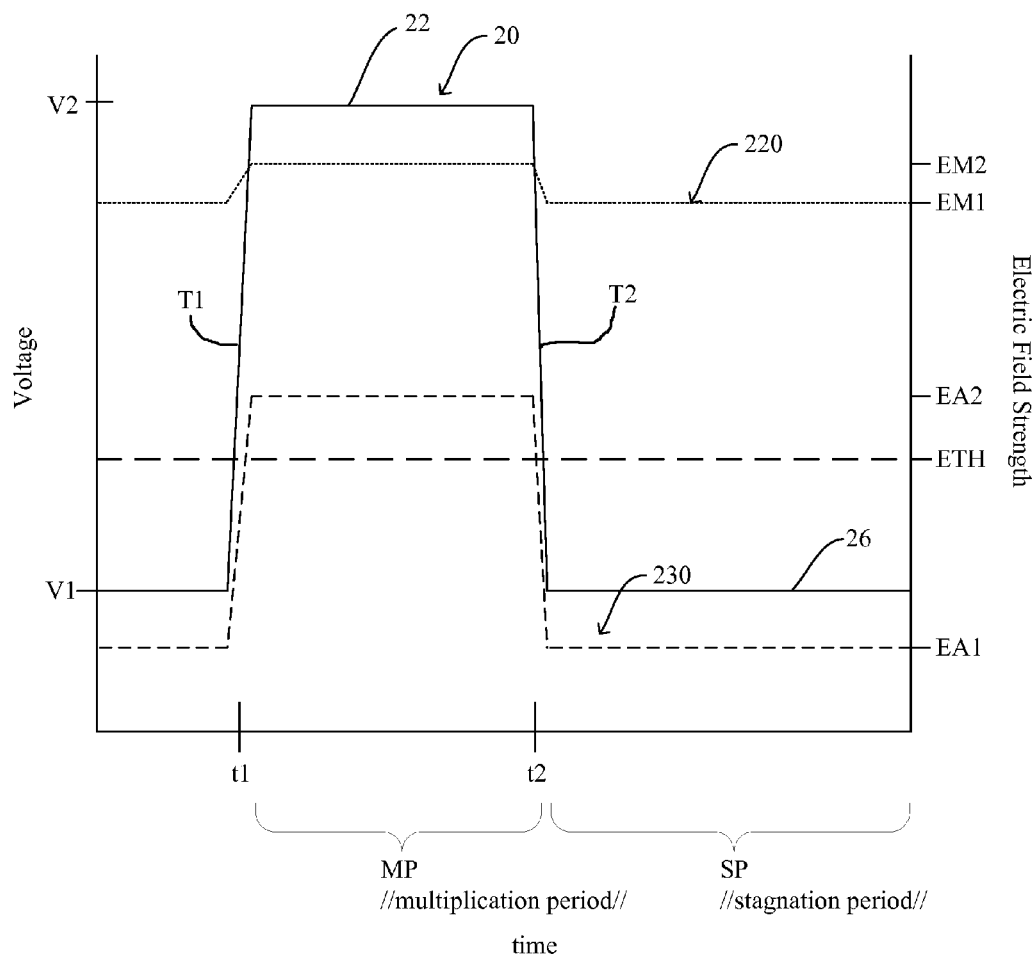
FIG. 4 shows a graph of voltage and electric field strength versus time respectively for a primary waveform and electric field strength curves for a multiplication region and an absorption region of a photon detector.

With reference to FIG. 4, which is a graph of voltage (left-hand side y-axis) and electric field strength (right hand side y-axis) versus time, first electric field E1 (in multiplication region 200) is characterized by first electric field strength curve 220, and second electric field E2 (in absorption region 202) is characterized by second electric field strength curve 230. During first gate 22 (similarly for second gate 24) first electric field E1 has first electric field strength EM1 that decreases to a second electrical strength EM2 during inter-gate period 26. Correspondingly, during first gate 22, second electric field E2 has second electric field strength EA2 that decreases to second electric field strength EA2 during inter-gate period 26. Also indicated in FIG. 4 is a dashed line for a value of threshold electric field strength (ETH). As used herein, threshold electric field strength ETH refers to a minimum value of the electric field strength required to move a charge carrier in absorption region 202 so that the charge carrier is displaced from absorption region 202, through any intervening grading layer, and into multiplication region 200. Therefore, when second electric field E2 has an electric field strength less than threshold electric field strength ETH (e.g., when second electric field E2 is at first electric field strength EA1), the charge carrier remains in absorption region 202 and is not displaced from absorption region 202 to multiplication region 200. In contrast, when second electric field E2 has an electric field strength greater than threshold electric field strength ETH (e.g., when second electric field E2 is at second electric field strength EA2), the charge carrier moves in absorption region 202 to be displaced from absorption region 202 to multiplication region 200. In this manner, during first gate 22, second electric field E2 has second electric field strength EA2 (greater than threshold electric field strength ETH) such that the charge carrier in absorption region 202 is moved from absorption region 202 into multiplication region 200 that has first electric field E1 at second electric field strength EM2, which causes multiplication of the charge carrier to produce a plurality of charge carriers in multiplication region 200. As such, first gate 22 (similarly second gate 24) is a multiplication period MP. Furthermore, during inter-gate period 26, second electric field E2 has first electric field strength EA1 (less than threshold electric field strength ETH) such that the charge carrier in absorption region 202 remains in absorption region 202 and is not displaced into multiplication region 200 (which has first electric field E1 at first electric field strength EM1) such that multiplication of the charge carrier does not occur in in multiplication region 200. As such, inter-gate period 26 is a stagnation period SP during which the charge carrier remains in absorption region 202, and charge carriers are not multiplied in multiplication region 200.

Figure 5:
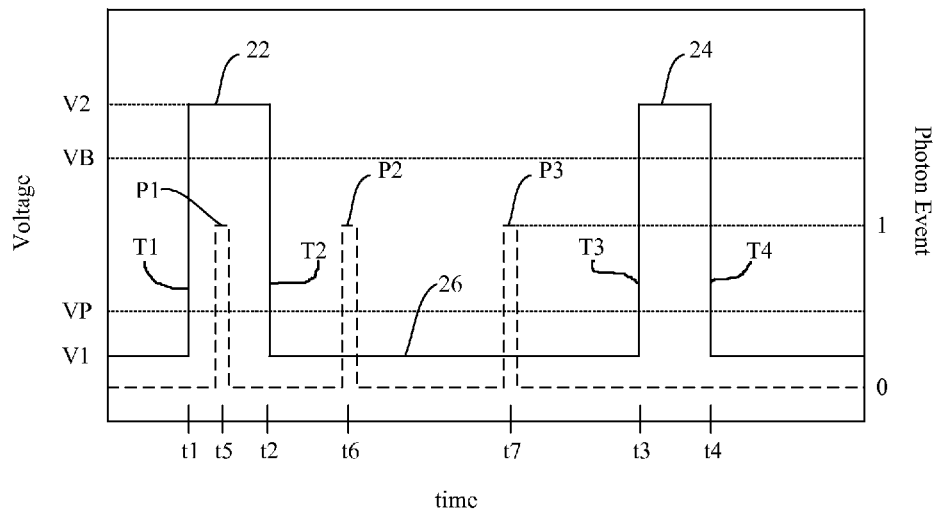
FIG. 5 shows a graph of voltage and photon event versus time for the absorption of a plurality of single photons by a photon detector.

In an embodiment, with reference to FIG. 5, which is a graph of voltage (left-hand y-axis) and photon event (right-hand y-axis, wherein a value of 0 indicates no photon, and a value of 1 indicates absorption of a photon in absorption region 202) versus time, photon detector 4 is configured to receive a photon in absorption region 202, to produce a charge carrier in response to receipt of the photon in absorption region 202, to selectively communicate the charge carrier from absorption region 202 multiplication region 200 based on a voltage amplitude of primary waveform 20 relative to punch-through voltage range VP of photon detector 4, and to selectively multiply the charge carrier to produce a plurality of charge carriers from the charge carrier in multiplication region 200 based on a voltage amplitude primary waveform 20 relative to breakdown voltage VB of photon detector 4. As shown in FIG. 5, first photon P1 is absorbed at time t5 in absorption region 202 during first gate 22 such that the charge carrier is produced in absorption region 202, transmitted to multiplication region 200, and multiplied in multiplication region 200. Subsequently, second photon P2 is absorbed at time t6 in absorption region 202 during inter-gate period 26 such that the charge carrier is produced in absorption region 202 but is not transmitted to multiplication region 200 from absorption region 202 nor multiplied in multiplication region 200. Thereafter, third photon P3 is absorbed at time t7 in absorption region 202 during inter-gate period 26 such that the charge carrier is produced in absorption region 202 but is not transmitted to multiplication region 200 from absorption region 202 nor multiplied in multiplication region 200.

Figure 6:
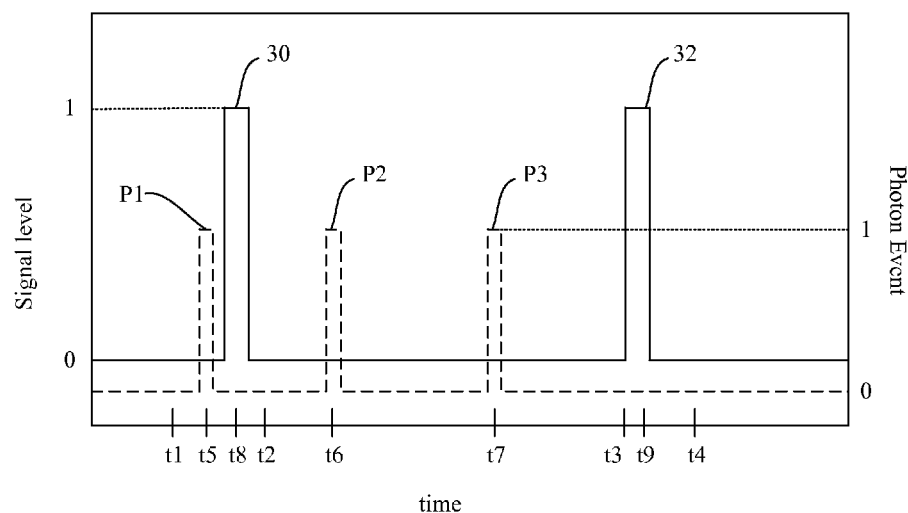
FIG. 6 shows a graph of signal level and photon event versus time corresponding to absorption of the plurality of single photons shown in FIG. 5.

According to a voltage amplitude of primary waveform 20, photon detector 4 responds to absorption of photons (e.g., first photon P1, second photon P2, third photon P3) as shown in FIG. 6, which is a graph of signal level (left-hand y-axis) and photon event (right-hand y-axis) versus time. Here, signal level corresponds to detection by photon detector 4 of the charge carrier (i.e., multiplication of the charge carrier or lack thereof) produced in response to receipt of the photon such that signal level has a value of 0 when no multiplication in multiplication region 200 occurs, and signal level has a value of 1 when multiplication of the charge carrier in multiplication region 200 occurs. Accordingly, first photon P1 arrived at photon detector 4 at time t5 during first gate 22, and photon detector 4 responded to absorption of first photon P1 by multiplying the charge carrier produced from absorption of the first photon P1 and producing first signal 30 at time t8 having a signal level of value 1. It should be recognized that although FIG. 6 shows for signal level a binary value (0 or 1) for detection of photons by multiplication of charge carriers producing a value of signal level being 1 or for no detection of charge carriers with a value of signal level being 0, the output of photon detector 4 is a photon detector waveform that includes a signal pulse (corresponding to first signal 30) intermixed with components (e.g., harmonics) from primary waveform 20, e.g., see exemplary output of photon detector 4 shown in FIG. 12 as photon detector waveform 110.

With further reference to FIG. 6, second photon P2 and third photon P3 arrived respectively at time t6 and time t7 during inter-gate period 26 such that photon detector 4 produced a signal level 0 during inter-gate period 26 due to lack of multiplication of charge carriers. It will be appreciated that during inter-gate period 26 charge carriers produced from absorption of the second photon P2 and third photon P3 were maintained in absorption region 202 (or optionally a grading layer interposed between absorption region 202 and multiplication region 200) without displacement to multiplication region 200. Thereafter, during the second gate 24 charge carriers produced from absorption of second photon P2 and third photon P3 in absorption region 202 were displaced from absorption region 202 (or optional grading layer) to multiplication region 200 and multiplied to produce a plurality of charge carriers, and photon detector 4 responded to production of the plurality of charge carriers by producing at time t9 second signal 32 (which is output from photon detector 4 in a photon detector waveform that intermixes second signal 32 with components from primary waveform 20 in a photon detector waveform, e.g., photon detector waveform 110 having a signal level of value 1.

It should be appreciated that a free charge carrier produced by absorption of a single photon drifts (i.e., is displaced) from absorption region 202 into multiplication region 200 when photon detector 4 is biased above breakdown voltage VB, a runaway avalanche multiplication process occurs. In response, photon detector 4 produces first signal 30 (e.g., a discriminable avalanche signal, intermixed with components from primary waveform 20 in a photon detector waveform, e.g., photon detector waveform 110) at time t8 shortly following photon absorption at time t5 and during first gate 22. It also should be appreciated that absorption of second photon P2 and third photon P3 at times t6 and t7 occurs during inter-gate period 26 such that under the biasing conditions provided by primary waveform 20, photon detector 4 produces no immediate output. Rather, free charge carriers produced by absorption of photons P2 and P3 do not drift into multiplication region 200 until the voltage bias provided by primary waveform 20 increases during second gate 24. At a start of second gate time t3, runaway avalanche multiplication occurs, and photon detector 4 produces a second signal 32 (e.g., a discriminable avalanche signal, also intermixed with components from primary waveform 20 in a photon detector waveform, e.g., photon detector waveform 110) that indicates detection of a photon during inter-gate period 26 and interposed between time t2 (end of first gate 22) and end of the second gate 24 at time t4. In this manner, all photon events arising from absorption of a photon in absorption region 202 of photon detector 4 are detected by photon detector 4.

Figure 7:
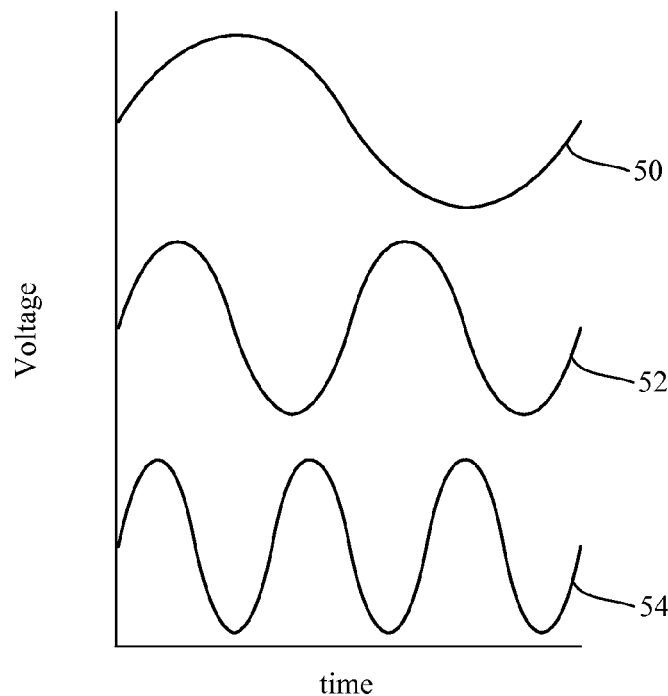
FIG. 7 shows a graph of voltage versus time for a plurality of sine waves.

According to an embodiment, primary waveform 20 is produced using a commercially available function generator. In an embodiment, primary waveform 20 is selectively produced by superposition of a plurality of waveforms. In a particular embodiment, source 10 produces a primary waveform 20 from a superposition of a plurality of waveforms. As shown in FIG. 7, a plurality of sine waves that are superposed by source 10 to form primary waveform 20 include fundamental 50 sinusoidal wave, second harmonic 52 of fundamental 50, and third harmonic 54 of fundamental 50. In an embodiment, source 10 is configured such that component waveforms (e.g., fundamental 50, second harmonic 52, third harmonic 54) of primary waveform 20 have a stable and fixed relative phase and amplitudes that are selected to form primary waveform 20. According to an embodiment, a bias voltage (e.g., a fixed DC bias voltage) is applied to photon detector 4 via electrical path 12. It is contemplated that the bias voltage is produced by, e.g., a DC voltage source or is included in the primary waveform 20 as a constant voltage component of primary waveform 20.

According to an embodiment, a process for making primary waveform 20 includes providing a first waveform; optionally adjusting an amplitude of the first waveform; providing a second waveform; optionally adjusting an amplitude of the second waveform; optionally providing a third waveform; optionally adjusting an amplitude of the third waveform; adjusting a relative phase (or adjusting or maintaining a stable relative phase) between the first waveform, second waveform, and optionally third waveform; combining the first waveform, second waveform, third waveform, or combination thereof to produce an intermediate waveform; and providing a voltage offset to the intermediate waveform to make primary waveform 20, wherein the voltage offset has a value effective to form a selected primary waveform. It is contemplated that the voltage offset can be 0 volts (V), negative, or positive.

Figure 8:
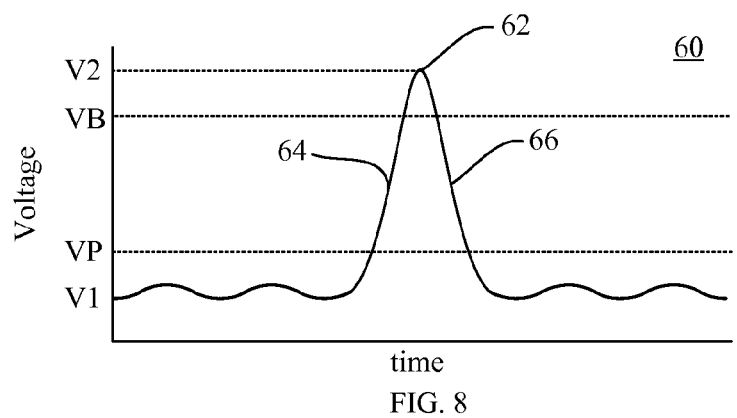
FIG. 8 shows a graph of voltage versus time for a primary waveform.

According to an embodiment, as shown in FIG. 8 (which is a graph of voltage versus time), primary waveform 60 (e.g., formed by selecting a phase or amplitude of harmonic components (fundamental 50, second harmonic 52, third harmonic 54) and DC bias) includes first voltage level V1 and peak voltage 62 having second voltage level V2. First voltage level V1 is less than punch-through voltage range VP, and second voltage level V2 is greater than the breakdown voltage VB of photon detector 4. A voltage of the primary waveform 60 increases from first voltage level V1 to second voltage level V2 via rising edge 64. The voltage of the primary waveform 60 decreases from second voltage level V2 to first voltage level V1 via falling edge 66. Peak voltage 62 at a second voltage level V2 is greater than breakdown voltage VB. First voltage level V1 is sufficiently low to prevent displacement of the charge carrier from absorption region 202 to multiplication region 200.

Figure 9:
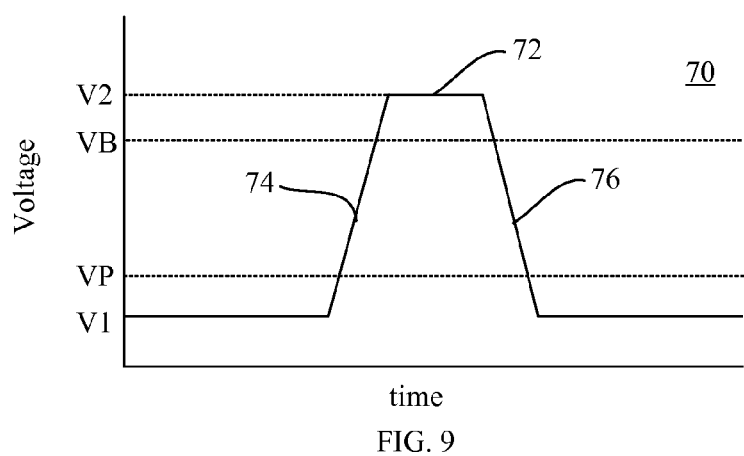
FIG. 9 shows a graph of voltage versus time for a primary waveform.

According to an embodiment, as shown in FIG. 9 (which is a graph of voltage versus time), primary waveform 70 includes peak voltage 72 having second voltage level V2, rising edge 74 that occurs from a transition between first voltage level V1 to second voltage level V2, and falling edge 76 that occurs from a transition between second voltage level V2 to first voltage level V1. First voltage level V1 is sufficiently low to inhibit drift of photo-generated charge carriers into multiplication region 200. Here, rising edge 74 or falling edge 76 has a substantially constant slope, wherein peak voltage 72 is greater than breakdown voltage VB.

Figure 10:
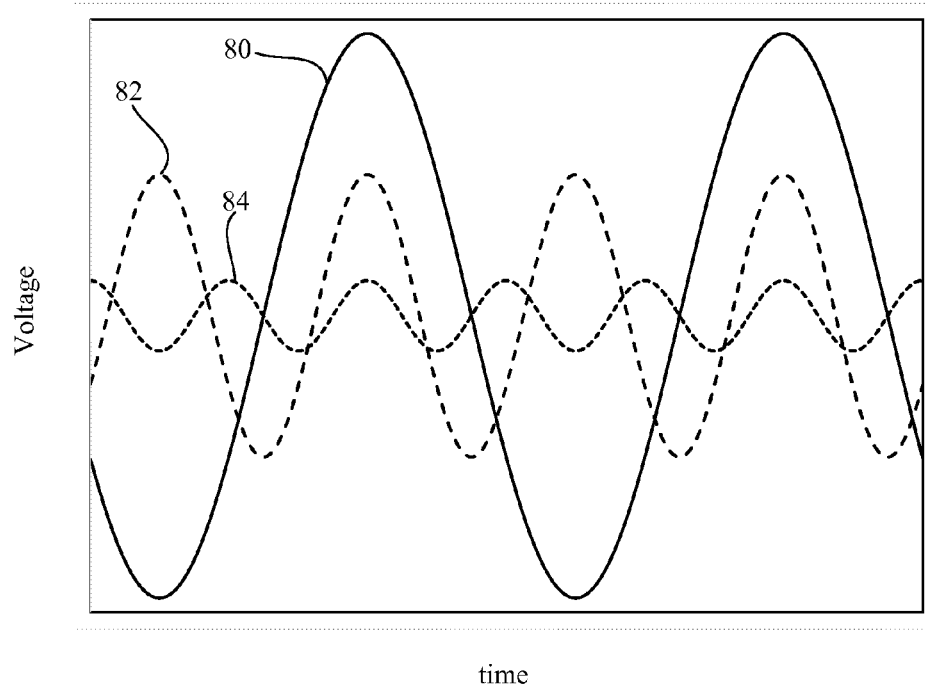
FIG. 10 shows a graph of voltage versus time for a plurality of sine waves.
Figure 11:
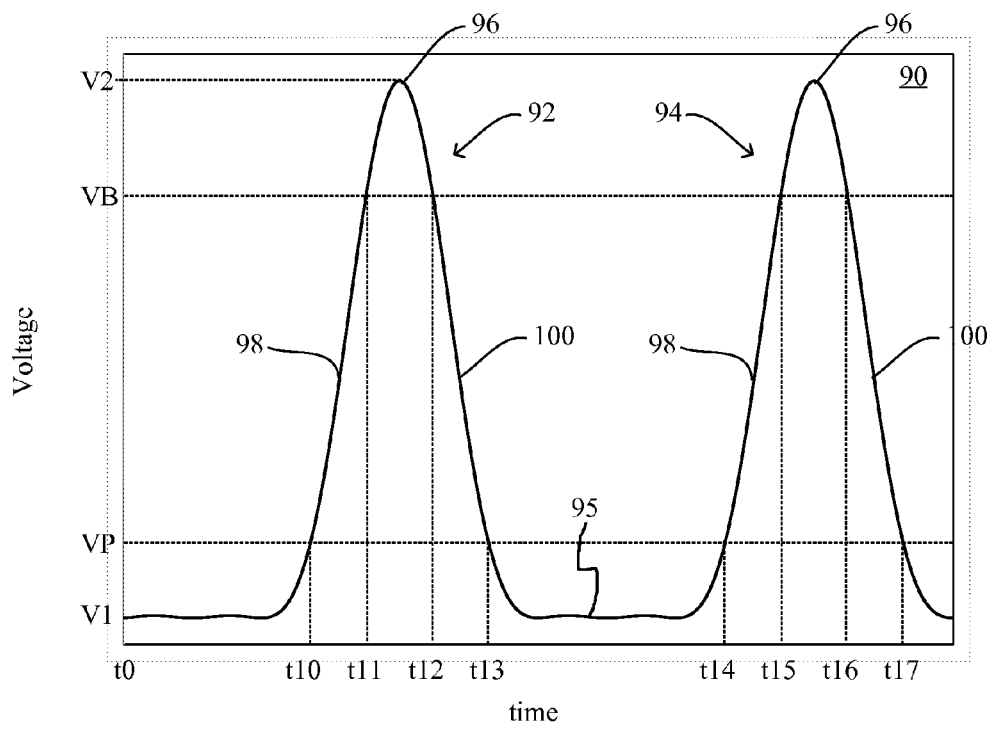
FIG. 11 shows a graph of voltage versus time for a primary waveform formed by a superposition of the plurality of sine waves shown in FIG. 11.

In an embodiment, with reference to FIG. 10 (which shows graph of voltage versus time for a plurality of waveforms) and FIG. 11 (which shows a graph of voltage versus time for a primary waveform 90), primary waveform 90 is produced by source 10 from superposition of fundamental 80, second harmonic 82, and third harmonic 84, which are sinusoidal waves. Here, fundamental 80 has the largest peak-to-peak amplitude. Second harmonic 82 has a peak-to-peak amplitude that is one-half of the peak-to-peak amplitude of fundamental 80. Third harmonic 84 has a peak-to-peak amplitude that is one-eighth of the peak-two-peak amplitude of fundamental 80. A relative phase of fundamental 80, second harmonic 82, and third harmonic 84 is selected to produce primary waveform 90. Here, primary waveform 90 includes first voltage level V1 at time t0 and a plurality of peak voltages 96. Primary waveform 90 also includes first gate 92 having second voltage level V2 and second gate 94 having second voltage level V2. During rising edge 98, the voltage of primary waveform 90 increases from first voltage level V1 at time t0 to greater than the punch through voltage VP at time t10, to greater than breakdown voltage VB at time t11, and to second voltage level V2 at peak voltage 96 of first gate 92. During falling edge 100, the voltage of primary waveform 90 decreases from peak voltage 96 of first gate 92 to less than breakdown voltage VB at time t12, to less than punch through voltage VP at time t13, and to first voltage level V1 during the inter-gate period 95. Thereafter, the voltage of primary waveform 90 during rising edge of second gate 94 increases from first voltage level V1 to greater than the punch through voltage VP at time t14, to greater than breakdown voltage VB at time t15, and to second voltage level V2 at peak voltage 96. During falling edge 100, the voltage of primary waveform 90 decreases from peak voltage 96 of second gate 94 to less than breakdown voltage VB at time t16, to less than punch through voltage VP at time t17, and to first voltage level V1 after second gate 94. According to an embodiment, primary waveform 90 is periodic and is selectively repeatable at a selected frequency for a selected number of times.

In an embodiment, falling edge 100 of primary waveform 100 has a slope such that, during a duration of time from time t12 to time t13 (e.g., during inter-gate period 95) photon detector 4 is biased at a voltage less than breakdown voltage VB but greater than a voltage to prevent charge carriers in absorption region 202 from being displaced from absorption region 202 to multiplication region 200, the duration is sufficiently long to allow a free charge carrier in multiplication region 200 to be removed from photon detector 4.

According to an embodiment, a photon detector article includes a photon detector configured to receive a primary waveform. The photon detector includes a multiplication region, a photon absorption region, a punch through voltage range, and a breakdown voltage. The photon detection article also includes a source in electrical communication with the photon detector and configured to provide the primary waveform. The primary waveform includes a first voltage that is less than a maximum value of the punch through voltage range or is effective to maintain a charge carrier in the absorption region; and a second voltage that is greater than the breakdown voltage. The photon detector article further includes a reference member in electrical communication with the source and configured to provide a reference waveform in response to receiving the primary waveform. In an embodiment, the photon detector further is configured to receive a single photon and to produce a signal pulse in response to receipt of the single photon. In a certain embodiment, the photon detector is a voltage-variable capacitor that is configured to produce a photon detector waveform that includes a positive pulse corresponding to a transition from the first voltage to the second voltage; a negative pulse corresponding to a transition from the second voltage to the first voltage; and the signal pulse interposed between the positive pulse and the negative pulse. It is contemplated that the photon detector provides the photon detector waveform to the combiner as in output of the photon detector produced in response to absorption of a photon in the absorption region, production of the charge carrier in the absorption region, displacement of the charge carrier from the absorption region to the multiplication region, and multiplication of the charge carrier to a plurality of charge carriers, wherein the plurality of charge carriers are present as the signal pulse in the photon detector waveform.

Figure 12:
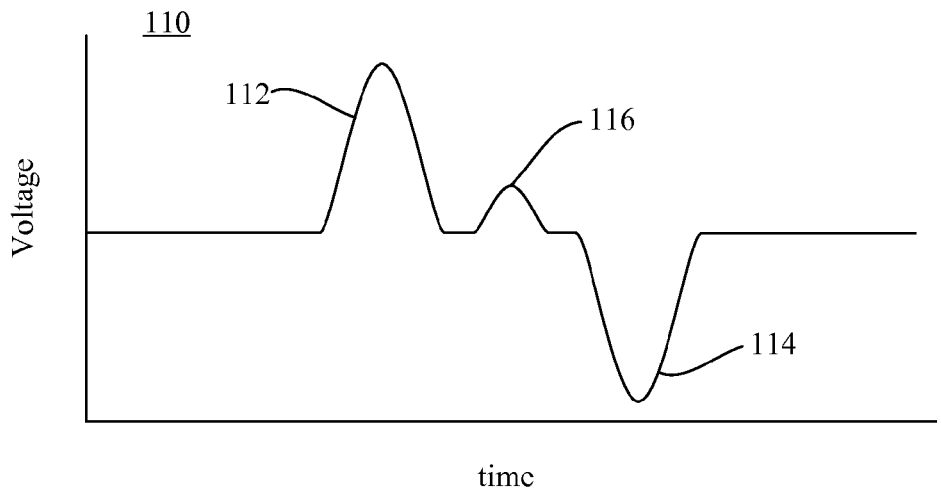
FIG. 12 shows a graph of voltage versus time for a photon detector waveform.

According to an embodiment, photon detector 4 produces photon detector waveform 110 shown in FIG. 12 in response to being subjected to a primary waveform, e.g., primary waveform 70 shown in FIG. 9 or primary waveform 90 shown in FIG. 11. A voltage-variable capacitance of photon detector 4 modifies primary waveform 90 by attenuating, phase shifting, or intermixing harmonic components (80, 82, 84) of primary waveform (90). Accordingly, in an embodiment, photon detector waveform 110 includes positive pulse 112 corresponding to rising edge 98 of primary waveform 90 and negative pulse 114 corresponding to falling edge 100 of primary waveform 90. In response to multiplication of charge carriers in multiplication region 202 during a gate (e.g., first gate 92 or second gate 94), signal pulse 116 is interposed between the positive pulse 112 and negative pulse 114 and temporally corresponds to when photon detector 4 was biased above breakdown voltage VB.

Figure 13:
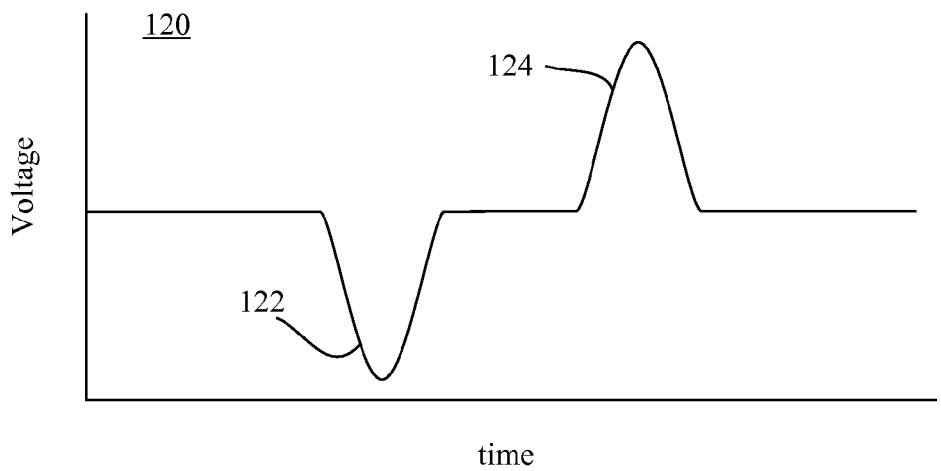
FIG. 13 shows a graph of voltage versus time for a reference waveform.
Figure 14:
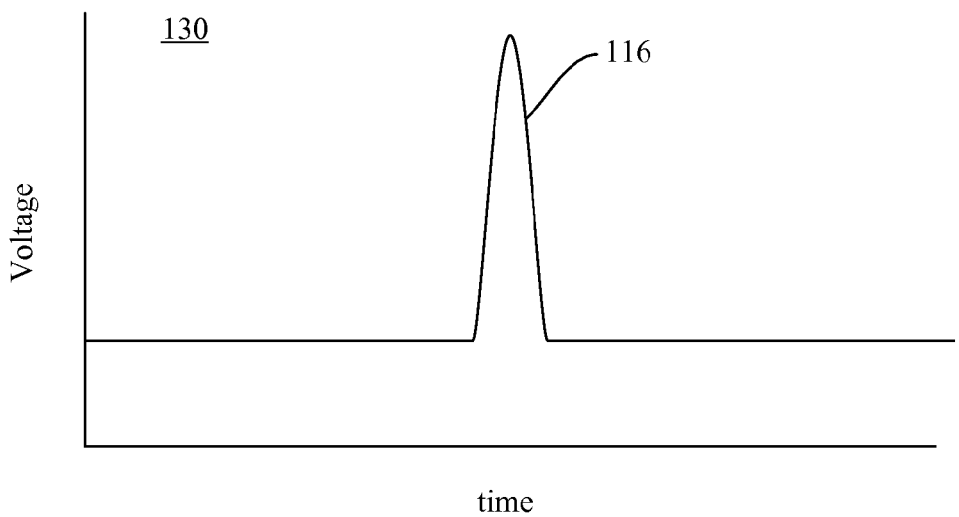
FIG. 14 shows a graph of the voltage versus time for a signal waveform.

In an embodiment, photon detector article 2 further includes combiner 16 in electrical communication with photon detector 4 and reference member 14. Combiner 16 combines photon detector waveform 110 and reference waveform 120 (C FIG. 13) produced by a reference member 14 to produce a signal waveform 130 (see FIG. 14). In this manner, combiner 16 produces signal waveform 130 that is substantially only signal pulse 116 corresponding to absorption of the photon in absorption region 202 that propagated creation of the charge carrier from the photon, displacement of the charge carrier from absorption region 202 into multiplication region 200, and multiplication of the charge carrier into a plurality of charge carriers.

As such, combiner 16 eliminates positive pulse 112 and negative pulse 114 in photon detector waveform 110 to discriminate signal pulse 116 by destructively combining reference waveform 120 (having first complimentary pulse 122 and second complimentary pulse 124) with photon detector waveform 110. In this manner, components (e.g., 122, 124) in reference waveform 120 destructively interfere with harmonic components (e.g., 80, 82, 84) in photon detector waveform 110 when combiner 16 superimposes reference waveform 120 and photon detector waveform 110 to produce signal waveform 130 consisting essentially of signal pulse 116. Signal pulse 116 can be provided from combiner 16 to detector 18 via electrical path 12. Detector 18, e.g., can be a digital or analog detector and include members such as a comparator, amplifier, oscilloscope, data acquisition board, boxcar integrator, and the like.

According to an embodiment, photon detector 4 is a diode such as a single-photon avalanche diode. An exemplary diode is variable-capacitance diode.

In a particular embodiment, a process for making a photon detection article and includes providing a photon detector, electrically connecting the photon detector to a source to provide the primary waveform to the photon detector, electrically connecting the source to a reference member, electrically connecting the reference member to combiner that is also electrically connected to the photon detector, optionally electrically connecting the combiner to an electrical detector, and optionally providing a light source in optical communication with the photon detector.

Without wishing to be bound by theory, it is believed that the voltage applied to photon detector 4 at which charge carriers generated by photon absorption in absorption region 202 are prevented from being displaced from absorption region 202 to multiplication region 200 has an amplitude of comparable magnitude to punch-through voltage range VP. According to an embodiment, a voltage difference between breakdown voltage VB and a maximum value of punch-through voltage range VP is decreased by reducing a temperature of photon detector 4. In an embodiment, an exemplary photon detector 4 (e.g., a single photon avalanche diode) at a temperature of 300 K has breakdown voltage VB of 70 V and a punch through voltage VP of 35 V. At 100 K, exemplary photon detector 4 has breakdown voltage VB of 50 V and punch through voltage VP of 37 V. Accordingly, in response to being cooled from 300 K to 100 K, exemplary photon detector the voltage difference between breakdown voltage VB and punch through voltage VP decreased from 35 V to 13 V. It is contemplated that reducing the temperature of photon detector 4 reduces a peak-to-peak amplitude of the primary waveform.

The photon detector article has numerous beneficial advantages and properties. The primary waveform has a duty cycle that is less than or equal to 75%, specifically less than 50%, and more specifically less than 25%. The primary waveform is a repetition rate from 100 Hertz (Hz) to 5 GHz, specifically from 100 kHz to 3 GHz, and more specifically from 600 MHz to 1.5 GHz. Further, primary waveform has a peak-to-peak voltage amplitude from the first voltage to the second voltage that is from 1 V to 50 V, specifically from 5 V to 45 V, and more specifically from 20 V to 45 V. In an embodiment, the peak to peak voltage amplitude from the first voltage to the second voltage is greater than or equal to 15 V, specifically greater than or equal to 20 V. The first gate and second gate independently include a full-width at half-maximum pulse width from 10 ps to 10 ns, specifically from 100 ps to 1 ns, and more specifically from 100 ps to 300 ps.

Additionally, the photon detector article has a high sensitivity for detection of photons absorbed in the absorption region of the photon detector. According to an embodiment, the photon detector article is configured to discriminate avalanche signals that have a small amplitude. In an embodiment, the photon detector article is configured to detect photon that produce a signal pulse having an amplitude that is less than 2 mV (without amplification) at an anode of the photon detector over a 50 ohm load.

In an embodiment, a process for detecting a single photon includes producing, by a source, a primary waveform that includes a first voltage and a second voltage; receiving, by a photon detector, the primary waveform, the photon detector includes a punch-through voltage (such that the first voltage is less than a maximum value of the punch-through voltage range or is effective to maintain a charge carrier in the absorption region) and a breakdown voltage that is less than the second voltage; biasing the photon detector according to the primary waveform; receiving, by the photon detector, a single photon; producing, by the photon detector, a photon detector waveform in response to receiving the single photon and the primary waveform (wherein the photon detector waveform includes a positive pulse corresponding to a transition from the first voltage to the second voltage, a negative pulse corresponding to a transition from the second voltage to the first voltage, and a signal pulse interposed between the positive pulse and the negative pulse); receiving, by a reference member, the primary waveform; producing, by the reference member, a reference waveform in response to receiving the primary waveform; combining, by a combiner, the photon detector waveform and the reference waveform; producing, by the combiner, a signal waveform consisting essentially of the signal pulse; and detecting, by a detector, the signal pulse to detect the single photon.

In an embodiment, receiving the single photon occurs when the photon detector is biased at the second voltage or less than the punch through voltage. In some embodiments, producing the primary waveform includes forming a superposition of a plurality of sine waves. According to an embodiment, the plurality of sine waves includes a first sine wave comprising a fundamental frequency, a second sine wave comprising a second harmonic of the fundamental frequency, and a third sine wave comprising a third harmonic of the fundamental frequency. In this embodiment, the reference waveform consists of a plurality of sine waves, including a first sine wave comprising a fundamental frequency, a second sine wave comprising a second harmonic of the fundamental frequency, and a third sine wave comprising a third harmonic of the fundamental frequency. These sine waves in the reference waveform are adjusted to cause complete destructive interference with the sine waves in the detector waveform. As a result of this complete destructive interference, the output of the combiner is essentially the signal waveform.

According to an embodiment, a process for producing the signal pulse produced by absorption of a photon in the absorption region includes providing the photon detector waveform (e.g., comprising a plurality of sine waves) and the reference waveform (e.g., comprising the plurality of sine waves that are 180° out-of-phase with the sine waves in the photon detector waveform) to the combiner, and subtracting (e.g., by interference) the reference waveform from the primary waveform to produce the signal pulse as output of the combiner. In an embodiment, the primary waveform is a first superposition of a plurality of sine waves; the output of the photon detector (the photon detector waveform) is a second superposition of the signal pulse and plurality of sine waves; the output of the reference member (the reference waveform) is a third superposition of the plurality of sine waves; and the output of the combiner is the signal pulse. Here, the reference waveform includes the third superposition that is shifted 180° relative to components in the photon detector waveform derived from the primary waveform. Accordingly, the combiner combines the photon detector waveform and reference waveform to cancel components of the photon detector waveform that are out of phase with components of the reference waveform. In this manner, the combiner produces the signal pulse as the output of the combiner due to cancellation between the photon detector waveform and the reference waveform of out-of-phase components. Consequently, the combiner performs harmonic subtraction of the photon detector waveform and the reference waveform based on the out-of-phase components derived from the primary waveform. As a result, the combiner produces the signal pulse (e.g., the avalanche signal) embedded within the photon detector waveform due to complete interference of the plurality of sine waves in the primary waveform with the sine waves that are 180° out-of-phase in the reference waveform.

The photon detection article is numerous applications including detection of a single photon, a laser rangefinder, long-range fiber optic telecommunication device, portable detection in positron emission tomography or particle physics, and the like.

The articles and processes herein are illustrated further by the following examples, which are non-limiting.

EXAMPLES

Example

Detection of Single Photons During any Time of Arrival

A single photon avalanche diode (SPAD) was provided and connected to an electrical source that provided a primary waveform to the SPAD. A reference member was connected to the electrical source and also received the primary waveform. The SPAD and the reference member were connected to a combiner, and the output of the combiner was directed to a counter, which was triggered off a rising edge of a gate in the primary waveform. The primary waveform included the gate that had a voltage amplitude above the breakdown voltage of the SPAD and an inter-gate period having a voltage amplitude approximately that of the punch-through voltage of the SPAD and substantially less than the breakdown voltage so that multiplication of charge carriers present during the inter-gate was negligible in an output of the SPAD. The primary waveform was produced by superimposing three sine waves that included a first sine wave (the fundamental) having a frequency of 1.25 GHz, a second sine wave (second harmonic of the fundamental) at twice the frequency of the fundamental, and a third sine wave (third harmonic of the fundamental) at three times the frequency of the fundamental. According to this superposition of the fundamental, second harmonic, and third harmonic, the primary waveform had a period of 800 ps, and the gate had a full width at half maximum (FWHM) that was 300 ps.

The SPAD was an InGaAs/InP diode, and light having a wavelength of 1310 nm from a pulsed laser was directed onto the SPAD. Pulses of the light were controlled to have a pulse width of 20 ps, and the light was attenuated so that more than 90% of the counts detected by the SPAD were due to single photon absorption of the light.

Figure 15:
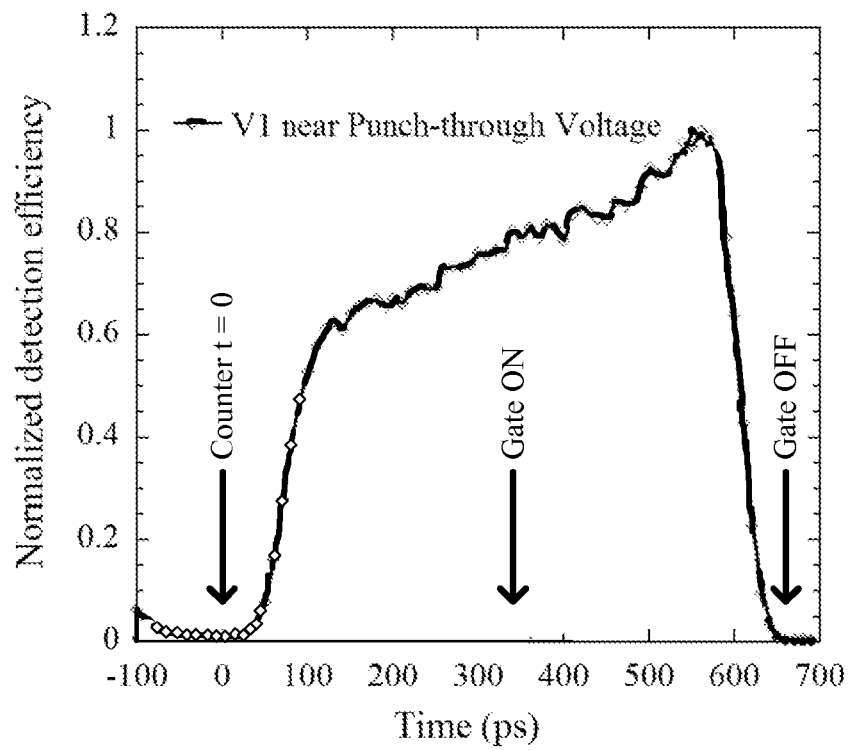
FIG. 15. shows a graph of normalized detection efficiency versus time according to Example.

FIG. 15 shows a graph of normalized detection efficiency versus time (in picoseconds) for detection of photons of light absorbed by the photon detector. The relative timing of the light pulse at the SPAD and the rising edge of the gate was controlled, and the time shown is relative to the trigger event of the counter. The counter was triggered relative to the rising edge of the gate such that the counter had a zero of time at t=0 ps (labeled in FIG. 15 as "Counter t=0"), and the rising edge of the gate (labeled as "Gate ON") occurred at a time delay of 350 ps, i.e., at t=350 ps. Since the temporal width of the gate was 300 ps, the falling edge of the gate (labeled as "Gate OFF") occurred at time t=650 ps relative to the counter being triggered (t=0).

Data points (shown as open diamonds) in FIG. 15 correspond to the arrival time of a light pulse at the SPAD, the time of which is indicated along the x-axis. The y-axis in FIG. 15 indicates the normalized detection efficiency for the number of counts from the laser pulse. Each data point represents the accumulation of multiple pulses of the laser. Accordingly, the SPAD detected photons over substantially all times for arrival of the light pulse at the SPAD. That is, even though Gate ON occurred at t=350 ps, photons that arrived during the inter-gate period before the SPAD was subjected to the gate at 350 ps (e.g., from t=25 ps to t=350 ps) were detected. It should be noted that the time indicated for the data points were for when the light pulse arrived at the SPAD (relative to the counter being triggered by the primary waveform) and not when the photon was detected, which occurred during a gate. As a result, the SPAD exhibited a high-efficiency for detection of nearly all light pulses with relatively few light pulses not detected by the SPAD. Moreover, even though the duty cycle of the primary waveform was about 35%, detection of light pulses was greater than 92%.

Comparative Example

Detection of Photons Only During a Gate

Figure 16:
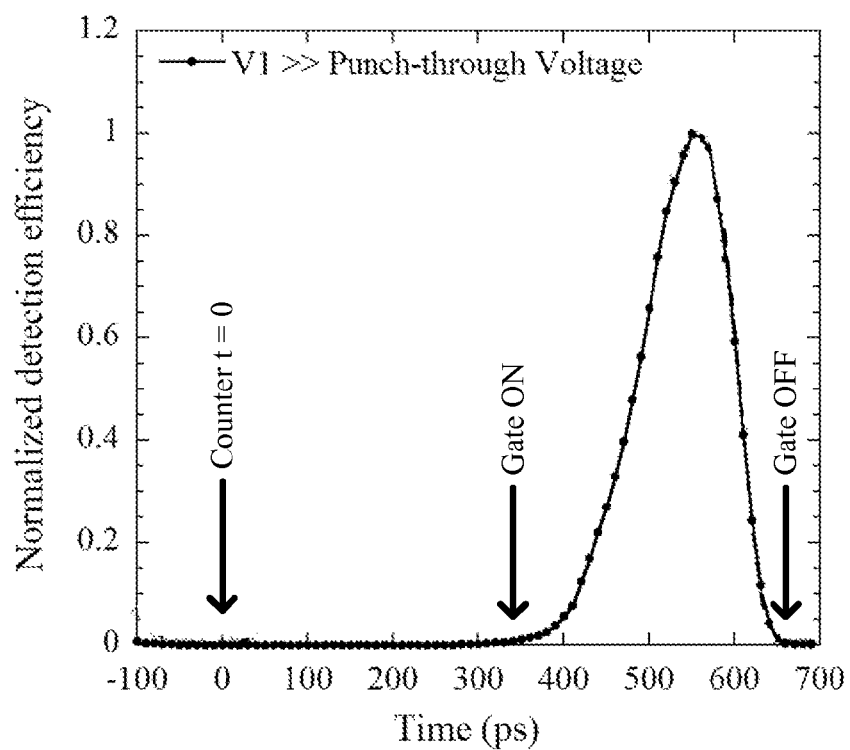
FIG. 16 shows a graph of normalized detection efficiency versus time according to Comparative Example.

In this Comparative Example and with reference to FIG. 16, the SPAD of the immediate prior Example was again used to detect photons from the laser under the same conditions as in the immediate prior Example except that the voltage amplitude of the inter-gate period was selected to be much greater than the punch-through voltage of the SPAD such that upon absorption of a photon during the light pulse, any charge carriers that were produced were immediately communicated from the absorption region to the multiplication region. As a result, only charge carriers present during the gate were detected.

FIG. 16 shows a graph of normalized detection efficiency versus time (in picoseconds) for detection of photons of light absorbed by the photon detector. Here, data points (shown as open filled circles) in FIG. 16 corresponded to the arrival time of light pulses at the SPAD relative to the trigger time (t=0) of the counter. As shown by the dotted curve through the data, SPAD detected photons only during the gate, i.e., the time from Gate ON to Gate OFF. Thus, in this configuration where the inter-gate period had a voltage amplitude much greater than the punch-through voltage of the SPAD, a substantial number of photons from the light pulses was not detected by the SPAD. That is, photons in light pulses from Gate ON at t=350 ps to Gate OFF at t=650 ps were detected with some efficiency, but photons from light pulses that arrived during the inter-gate period (that covered the remainder of the period the primary waveform, i.e., 500 ps) were not detected by the SPAD. As a result, the SPAD exhibited a reduced efficiency for detection of light pulses with relatively few light pulses being detected by the SPAD. Moreover, even though the duty cycle of the primary waveform was about 35%, detection of light pulses was less than 35%, and much less than 35% if efficiency of conversion of absolute number of incident photons absorbed by the SPAD is considered relative to the number of detected photons.

Figure 17:
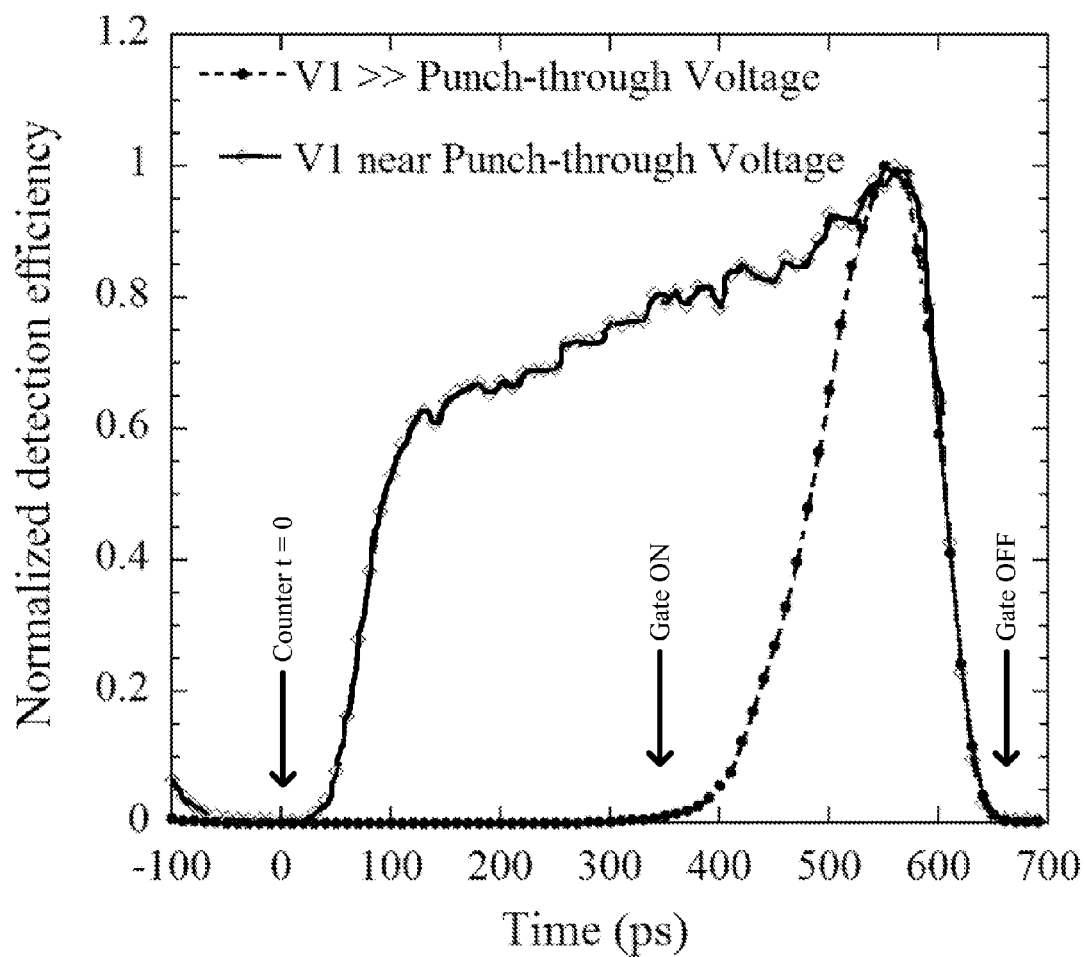
FIG. 17 shows a graph of normalized detection efficiency versus time for an overlay of data from Example and Comparative Example.

For direct comparison of data in the immediate prior Example (shown in FIG. 15) and the instant Comparative Example (shown in FIG. 16), FIG. 17 shows a graph of normalized detection efficiency versus time for an overlay of the data of FIGS. 15 and 16.

Illustrative Example

Exemplary Photon Detector Article

Figure 18:
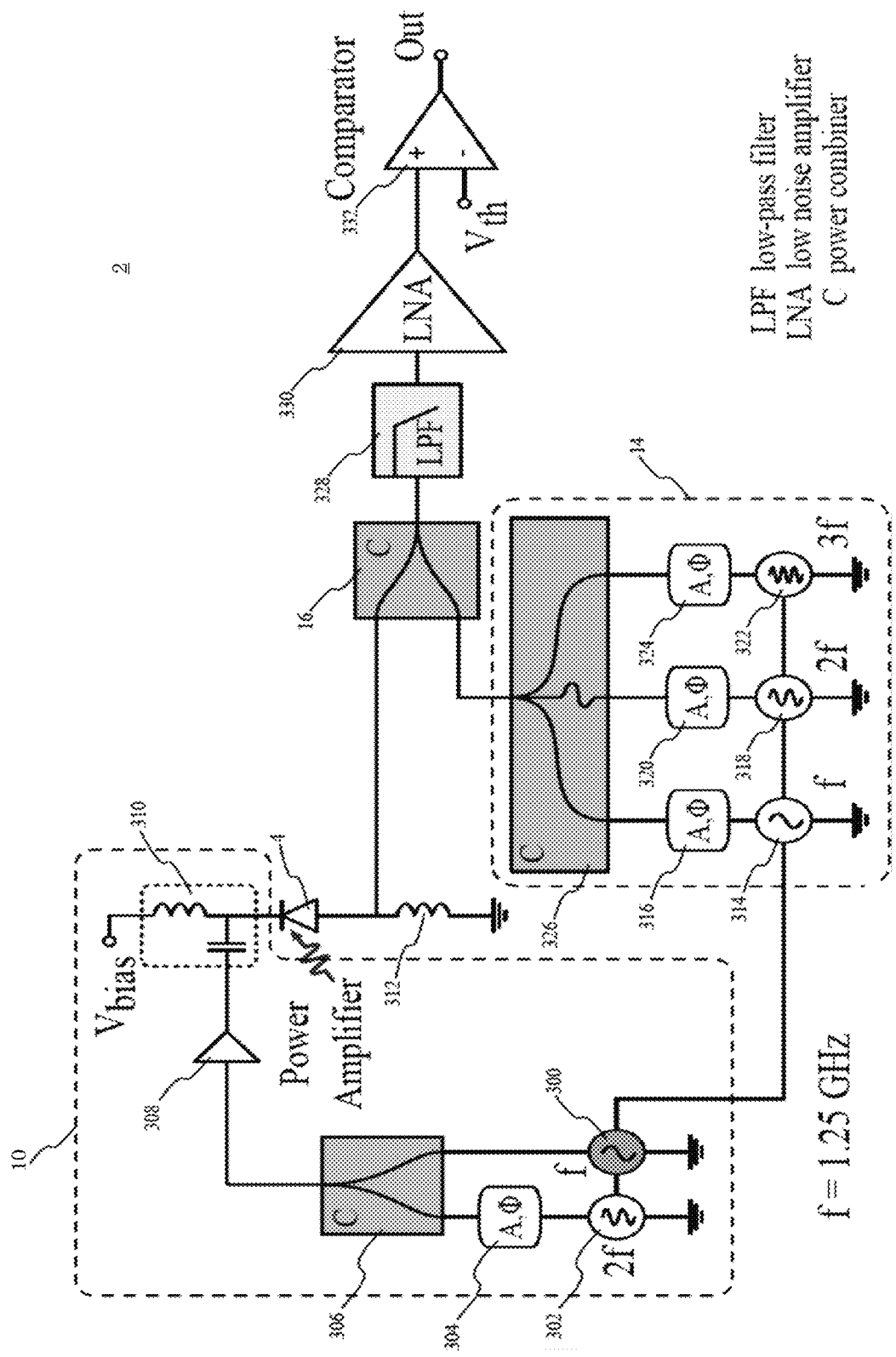
FIG. 18 shows an electrical schematic of a photon detection article.

With reference to FIG. 18, exemplary photon detector article 2 includes reference member 14, electrical source 10, photon detector 4, reference member 14, and combiner 16 that are in communication.

Electrical source 10 includes signal source 300 to produce first sinusoidal voltage waveform having frequency f. Signal source 300 is in electrical communication with frequency modifier 302 (e.g., a frequency doubler) that produces second sinusoidal voltage waveform having a higher frequency $2f$ than frequency f. Second sinusoidal waveform is produced with a stable phase relationship to signal source 300. The output of frequency modifier 302 is in electrical communication with amplitude and phase controller 304. Amplitude and phase controller 304 is an electronic circuit that adjusts the amplitude and phase of the second sinusoidal waveform at frequency $2f$. The output of amplitude and phase adjuster 304 is in electrical communication with combiner 306, which is also in electrical communication with the signal source 300. Combiner 306 adds the two input sinusoidal signal (i.e., first sinusoidal voltage waveform and second sinusoidal voltage waveform) to create a desired waveform at its output. The output of combiner 306 is in electrical communication with power amplifier 308 whose output is in electrical communication with a radio-frequency-input port of bias tee 310. The direct current input port of bias tee 310 is held at a constant voltage Vbias by an external voltage source. The output of bias tee 310 is the output of electrical source 10.

The output of electrical source 10 is in electrical communication with a cathode of photon detector 4. An anode of photon detector 4 is in electrical communication with a direct-current path to ground 312 and a first input of combiner 16. A second input of combiner 16 is in electrical communication with reference member 14.

Reference member 14 is in electrical communication with signal source 300, wherein first sinusoidal voltage waveform from signal source 300 is provided as an input to buffer amplifier 314, which is in electrical communication with amplitude and phase adjuster 316 (suitable for frequency f) and also in electrical communication with frequency modifier 318. Here, frequency modifier 318 produces third sinusoidal voltage waveform at frequency $2f$ with a stable phase relationship to signal source 300. Frequency modifier 318 is in electrical communication with amplitude and phase adjuster 320, which is suitable for frequency $2f$. Frequency modifier 318 also is in electrical communication with frequency adjuster 322, which produces fourth sinusoidal voltage wave at frequency $3f$, with a stable phase relationship to signal source 300. Frequency modifier 322 is in electrical communication with amplitude and phase controller 324.

Outputs of amplitude and phase adjusters 316, 320, and 324 are in electrical communication with combiner 326. Combiner 316 sums the three input waveforms (amplified first sinusoidal voltage waveform; third sinusoidal voltage waveform; and fourth sinusoidal voltage waveform) to produce a desired reference waveform. Accordingly, the reference waveform is provided at the output of combiner 326, which also is the output of reference member 14 and that is in electrical communication with combiner 16.

The output of combiner 16 is in electrical communication with low-pass filter 328. The output of low-pass filter 328 is in electrical communication with low-noise amplifier 330. The output of low-noise amplifier 330 is in electrical communication with threshold comparator 332, whose threshold voltage Vth is a voltage provided to an external source at its output terminal (labelled as Out).

While one or more embodiments have been shown and described, modifications and substitutions may be made thereto without departing from the spirit and scope of the invention. Accordingly, it is to be understood that the present invention has been described by way of illustrations and not limitation. Embodiments herein can be used independently or can be combined.

All ranges disclosed herein are inclusive of the endpoints, and the endpoints are independently combinable with each other. The ranges are continuous and thus contain every value and subset thereof in the range. Unless otherwise stated or contextually inapplicable, all percentages, when expressing a quantity, are weight percentages. The suffix "(s)" as used herein is intended to include both the singular and the plural of the term that it modifies, thereby including at least one of that term (e.g., the colorant(s) includes at least one colorants). "Optional" or "optionally" means that the subsequently described event or circumstance can or cannot occur, and that the description includes instances where the event occurs and instances where it does not. As used herein, "combination" is inclusive of blends, mixtures, alloys, reaction products, and the like.

As used herein, "a combination thereof" refers to a combination comprising at least one of the named constituents, components, compounds, or elements, optionally together with one or more of the same class of constituents, components, compounds, or elements.

All references are incorporated herein by reference.

The use of the terms "a" and "an" and "the" and similar referents in the context of describing the invention (especially in the context of the following claims) are to be construed to cover both the singular and the plural, unless otherwise indicated herein or clearly contradicted by context. "Or" means "and/or." It should further be noted that the terms "first," "second," "primary," "secondary," and the like herein do not denote any order, quantity, or importance, but rather are used to distinguish one element from another. The modifier "about" used in connection with a quantity is inclusive of the stated value and has the meaning dictated by the context (e.g., it includes the degree of error associated with measurement of the particular quantity). The conjunction "or" is used to link objects of a list or alternatives and is not disjunctive; rather the elements can be used separately or can be combined together under appropriate circumstances.

What is claimed is:

1. A photon detector article comprising:
   a photon detector configured to receive a primary waveform, the photon detector comprising:
      a multiplication region;
      a photon absorption region;
      a punch through voltage range; and
      a breakdown voltage;
   a source in electrical communication with the photon detector and configured to provide the primary waveform that comprises:
      a first voltage that is:
         less than a maximum value of the punch through voltage range, or
         effective to maintain a charge carrier in the absorption region; and
      a second voltage that is greater than the breakdown voltage; and
   a reference member in electrical communication with the source, the reference member being to provide a reference waveform in response to receiving the primary waveform.

2. The photon detector article of claim 1, wherein the photon detector further is configured to receive a single photon and to produce a signal pulse in response to receipt of the single photon.

3. The photon detector article of claim 2, wherein the photon detector is a voltage variable capacitor that is configured to produce a photon detector waveform comprising:
   a positive pulse corresponding to a transition from the first voltage to the second voltage;
   a negative pulse corresponding to a transition from the second voltage to the first voltage; and
   the signal pulse interposed between the positive pulse and the negative pulse.

4. The photon detector article of claim 3, further comprising a combiner in electrical communication with the photon detector and the reference member to combine the photon detector waveform and the reference waveform.

5. The photon detector article of claim 4, wherein the combiner is configured to produce a signal waveform, the signal waveform consisting essentially of the signal pulse.

6. The photon detector article of claim 5, wherein the primary waveform further comprises:
   a first gate;
   a second gate; and
   an inter-gate period interposed between the first gate and the second gate,
   wherein a voltage amplitude of the inter-gate period is less than the maximum value of the punch through voltage range or effective to maintain the charge carrier in the absorption region.

7. The photon detector article of claim 6, wherein the photon detector is configured to receive the single photon during the first gate, and to produce the signal pulse during the first gate.

8. The photon detector article of claim 6, wherein the photon detector is configured to receive the single photon during the inter-gate period and to produce the signal pulse during the second gate.

9. The photon detector article of claim 6, wherein the first gate comprises a first pulse width from 10 ps to 10 ns.

10. The photon detector article of claim 5, further comprising a detector to detect the signal waveform.

11. The photon detector article of claim 1, further comprising a light source to provide the single photon to the photon detector.

12. The photon detector article of claim 1, wherein the primary waveform further comprises a duty cycle that is less than or equal to 50%.

13. The photon detector article of claim 1, wherein the primary waveform further comprises a repetition rate from 100 Hz to 5 GHz.

14. The photon detector article of claim 1, wherein the primary waveform further comprises a peak-to-peak voltage amplitude from the first voltage to the second voltage that is from 1 V to 50 V.

15. The photon detector article of claim 1, wherein the primary waveform further comprises a superposition of a plurality of sine waves, the plurality of sine waves comprising:
   a first sine wave comprising a fundamental frequency;
   a second sine wave comprising a second harmonic of the fundamental frequency; and
   a third sine wave comprising a third harmonic of the fundamental frequency.

16. A process for detecting a single photon, the process comprising:
   producing, by a source, a primary waveform that comprises:
      a first voltage; and
      a second voltage;
   receiving, by a photon detector, the primary waveform, the photon detector comprising:
      a punch through voltage such that the first voltage is:
         less than a maximum value of the punch through voltage range, or
         effective to maintain a charge carrier in the absorption region; and
      a break down voltage that is less than the second voltage;
   biasing the photon detector according to the primary waveform;
   receiving, by the photon detector, a single photon;
   producing, by the photon detector, a photon detector waveform in response to receiving the single photon and the primary waveform, the photon detector waveform comprising:
      a positive pulse corresponding to a transition from the first voltage to the second voltage;
      a negative pulse corresponding to a transition from the second voltage to the first voltage; and
      a signal pulse interposed between the positive pulse and the negative pulse;
   receiving, by a reference member, the primary waveform;
   producing, by the reference member, a reference waveform in response to receiving the primary waveform;
   combining, by a combiner, the photon detector waveform and the reference waveform;
   producing, by the combiner, a signal waveform consisting essentially of the signal pulse; and
   detecting, by a detector, the signal pulse to detect the single photon.

17. The process of claim 16, wherein receiving the single photon occurs when the photon detector is biased at the second voltage or less than the punch through voltage.

18. The process of claim 16, wherein producing the primary waveform comprises forming a superposition of a plurality of sine waves.

19. The process of claim 18 wherein the plurality of sine waves comprises: a first sine wave comprising a fundamental frequency; a second sine wave comprising a second harmonic of the fundamental frequency; and a third sine wave comprising a third harmonic of the fundamental frequency.

* * * * *